(12) United States Patent
Wang et al.

(10) Patent No.: US 7,919,781 B2
(45) Date of Patent: Apr. 5, 2011

(54) GALVANIC ISOLATOR HAVING IMPROVED HIGH VOLTAGE COMMON MODE TRANSIENT IMMUNITY

(75) Inventors: Youfa Wang, Singapaore (SG); Chee Mang Wong, Singapore (SG); Teck Bee Chua, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 634 days.

(21) Appl. No.: 11/761,582

(22) Filed: Jun. 12, 2007

(65) Prior Publication Data
US 2008/0308817 A1    Dec. 18, 2008

(51) Int. Cl.
*H01L 27/15* (2006.01)
(52) U.S. Cl. .... 257/82; 257/666; 257/773; 257/E33.066
(58) Field of Classification Search .............. 257/82, 257/E33.066, 666, 773
See application file for complete search history.

(56) References Cited

U.S. PATENT DOCUMENTS

| 3,845,318 | A | * | 10/1974 | Thillays | 250/551 |
| 3,976,877 | A | * | 8/1976 | Thillays | 250/551 |
| 4,794,431 | A | * | 12/1988 | Park | 257/82 |

* cited by examiner

*Primary Examiner* — Thao X Le
*Assistant Examiner* — Robert Huber

(57) ABSTRACT

A galvanic isolator having a transmitter die, a receiver die, and a lead frame is disclosed. The transmitter die includes an LED having first and second contacts for powering the LED, and the receiver die includes a photodetector. The lead frame includes first and second transmitter leads, and first and second receiver leads. The transmitter die is bonded to the first lead, the first contact being connected electrically to the first transmitter lead and the second contact being connected to the second transmitter lead. The receiver die is connected to the first and second receiver leads. The LED and the photodetector are positioned such that light generated by the LED is received by the photodetector. The first and second transmitter leads are capacitively coupled to the first receiver lead. The capacitive couplings are characterized by first and second capacitance values that are substantially the same.

15 Claims, 6 Drawing Sheets

FIGURE 1
(PRIOR ART)
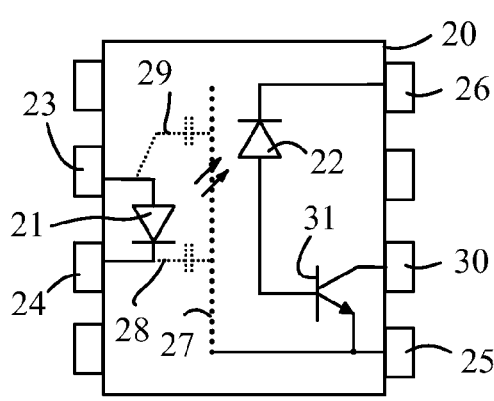
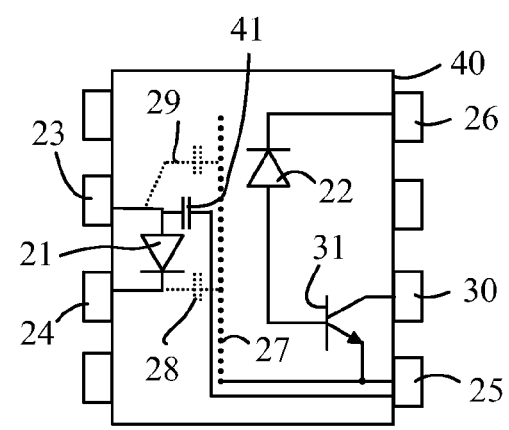
FIGURE 2

FIGURE 7
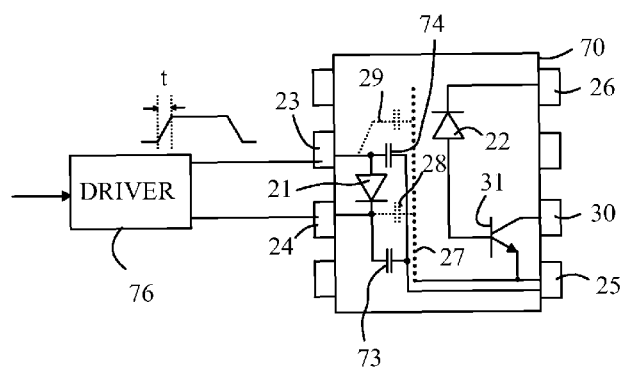
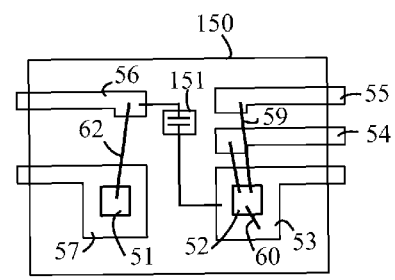
FIGURE 8

GALVANIC ISOLATOR HAVING IMPROVED HIGH VOLTAGE COMMON MODE TRANSIENT IMMUNITY

BACKGROUND OF THE INVENTION

In many circuit arrangements, a logic signal must be transmitted between two circuits that must otherwise be electrically isolated from one another. For example, the transmitting circuit could utilize high internal voltages that would present a hazard to the receiving circuit or individuals in contact with that circuit. In the more general case, the isolating circuit must provide both voltage and noise isolation across an insulating barrier.

Such isolation circuits are often referred to as "galvanic isolators". One class of galvanic isolators is based on transforming the logic signal to a light signal that is then transmitted to an optical receiver in the receiving circuit that converts the optical signal back to an electrical signal. The transmitting and receiving circuits are typically on separate substrates and connected to separate power supplies. Unfortunately, when there is high transient noise at both the low voltage and high voltage grounds, unwanted noise is unavoidably coupled from the input to the output.

High voltage common mode transient immunity (CMR) is a critical parameter of an isolator, as common mode noise problems exist in many electrical circuits. Prior art galvanic isolators rely on minimizing the parasitic capacitance between the anode of the LED in the transmitter and the ground of the photodetector on the receiver side of the isolator to minimize the common mode transient rejection of the isolator. Unfortunately, this approach still leads to unacceptable common mode transient rejection in some applications.

SUMMARY OF THE INVENTION

The present invention includes a galvanic isolator having a transmitter die, a receiver die, and a lead frame. The transmitter die includes an LED having first and second contacts for powering the LED. The receiver die includes a photodetector. The lead frame includes first and second transmitter leads, and first and second receiver leads. The transmitter die is bonded to the first lead, the first contact being connected electrically to the first transmitter lead and the second contact being connected to the second transmitter lead. The receiver die is connected to the first and second receiver leads. The LED and the photodetector are positioned such that light generated by the LED is received by the photodetector. The first and second transmitter leads are capacitively coupled to the first receiver lead. The capacitive couplings are characterized by first and second capacitance values that are substantially the same. In one aspect of the invention, the first capacitance is substantially equal to a parasitic capacitance between the first transmitter lead and the first receiver lead and the second capacitance is substantially equal to a parasitic capacitance between the second transmitter lead and the first receiver lead. In another aspect of the invention, the second capacitance includes a parasitic capacitance between the second transmitter lead and the first receiver lead and a capacitor connected to the second transmitter lead and the first receiver lead.

BRIEF DESCRIPTION OF THE DRAWINGS

FIG. 1 illustrates a prior art packaged optical galvanic isolator.

FIG. 2 illustrates an optical galvanic isolator according to one embodiment of the present invention.

FIG. 7 illustrates a galvanic isolator according to another embodiment of the present invention.

FIG. 8 illustrates another embodiment of a galvanic isolator according to the present invention.

DETAILED DESCRIPTION OF THE PREFERRED EMBODIMENTS OF THE INVENTION

Figure 3:
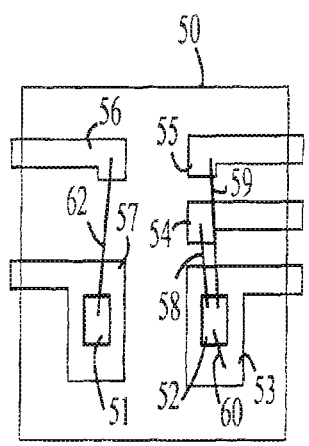
FIG. 3 illustrates a prior art lead frame packaging arrangement that is utilized in galvanic isolators.

The manner in which the present invention provides its advantages can be more easily understood with reference to FIG. 1, which illustrates a prior art packaged optical galvanic isolator. Galvanic isolator 20 includes an LED 21 and a photodiode 22. An electrical signal between pins 23 and 24 is converted to a light signal by LED 21. The light signal is detected by photodiode 22 and amplified by transistor 31 to provide an output on pin 30. Power is applied between pins 26 and 25 on the receiver side of galvanic isolator 20. To prevent transients from radiating from the transmitter side of galvanic isolator 20 to photodiode 22 and transistor 31, a transparent electrical shield 27 is connected to ground through pin 25.

While shield 27 blocks transients, it also results in a parasitic capacitance between the anode and cathode leads of LED 21 as indicated by the phantom capacitors shown at 28 and 29, respectively. As a result of these parasitic capacitors, a transient on pin 25 is coupled across LED 21. In general, the capacitance of capacitor 29 is different from that of capacitor 28, and hence, the transient will be coupled with different amplitudes by the two parasitic capacitors. As a result, a net transient current will be generated in photodiode 22, and this transient current will cause a light transient that is detected by photodiode 22.

To minimize this noise, prior art optical galvanic isolators attempt to minimize this parasitic capacitance. In general, the LED is part of a die that is mounted on one lead of a lead frame and connected to a second lead of the lead frame by a wire bond. One plate of parasitic capacitor 29 consists of the lead frame lead connecting the LED to pin 23. Similarly, one plate of parasitic capacitor 28 consists of the lead frame lead connecting the LED to pin 24. Prior art galvanic isolators attempt to reduce the transients by making the capacitances as small as possible, i.e., reducing the size of the leads in the lead frame. However, there is a lower limit to the size of the leads. One of the leads must have sufficient space to mount the LED die. The other lead must have sufficient space to accept a wire bond.

The present invention is based on the observation that the transient problem described above is the result of having different parasitic capacitances between the shield 27 connected to the ground lead on the receiver side of the galvanic isolator and the lead frame leads on which the LED is mounted. If the parasitic capacitance connecting the anode of the LED to the shield had the same capacitance as the parasitic capacitor connecting the cathode of the LED to the shield, then the transient would add the same potential to each lead of the LED, and no noise current through the LED would be generated.

Refer now to FIG. 2, which illustrates an optical galvanic isolator according to one embodiment of the present invention. For the purposes of this discussion, it will be assumed that parasitic capacitor 28 is larger than parasitic capacitor 29. Hence, to equalize the capacitive coupling between ground pin 25 and the anode and cathode of photodiode 22, an additional capacitor 41 is connected between pin 23 and pin 25. While capacitor 41 is ideally sized to exactly equalize the capacitive coupling, any capacitor that reduces the differences in the capacitive couplings could be utilized and still provide an improvement.

In principle, an external capacitor having the desired capacitance could be connected between the pins 23 and 25 of the galvanic isolator package. However, connections between the high voltage and low voltage sides of a galvanic isolator are not preferred as such connections could lead to other forms of device failure. For example, a discrete capacitor could cause a high voltage insulation failure during operation.

In one embodiment of the present invention, the capacitances coupling the ground in the receiver to the anode and cathode of the LED in the transmitter are equalized by adjusting the size and placement of the leads in the lead frame on which the galvanic isolator is implemented. Refer now to FIG. 3, which illustrates a frame packaging arrangement that is utilized in galvanic isolators. Galvanic isolator 50 is constructed from die 51 having an LED and a die 52 containing the photodiode and amplifier in the receiver.

Die 51 has two terminals that power the die. The first terminal is located on the bottom surface of the die and connected electrically to lead 57 by the bonding agent used to bond die 51 to lead 57. The second terminal is on the top surface of die 51 and is connected to lead 56 by a wire bond 62.

Die 52 has three terminals that are located on the top surface of die 52. Die 52 is bonded to lead 53, and the three terminals are connected by wire bonds 58-60 to leads 53-55, respectively. The ground terminal on the receiver is assumed to be lead 53.

The leads on which the dies are mounted have larger areas than those that receive only wire bond connection. The additional area is needed to accommodate the dies, which are larger than the area needed for a wire bond. In addition, the larger areas improve the heat transfer from the die. The capacitive coupling between lead 53 and lead 57 is significantly greater than the capacitive coupling between lead 53 and lead 56 for two reasons. First, the area of lead 57 is significantly larger than that of lead 56, and second, the distance from lead 56 to lead 53 is greater than that between lead 51 and lead 53.

Figure 4:
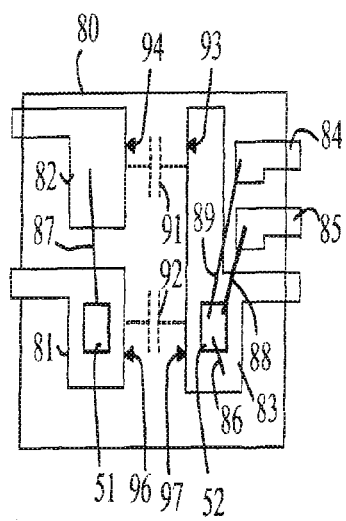
FIG. 4 illustrates a galvanic isolator according to one embodiment of the present invention.

Refer now to FIG. 4, which illustrates a galvanic isolator according to one embodiment of the present invention. Galvanic isolator 80 utilizes a die 51 having an LED thereon and a die 52 having a receiver in a manner analogous to that described above to form a transmitter-receiver pair. Die 51 is mounted on lead 81 and connected thereto by a contact on the bottom surface of die 51. A second contact on the top surface of the die is connected to lead 82 by wire bond 87. Die 52 has three contacts on the upper surface of die 52. These contacts are connected to leads 83-85 by wire bonds 86, 88, and 89.

The parasitic capacitance between lead 81 and lead 83 is indicated by the phantom capacitor shown at 92. Likewise, the parasitic capacitance between lead 82 and lead 83 is indicated by the phantom capacitor shown at 91. The shape and placement of leads 81, 82, and 83 is chosen to equalize capacitors 91 and 92. This is accomplished by increasing the area of lead 82 beyond that needed to provide a wire bond pad for wire bond 87 and increasing the area of lead 83 so that there is a section having a portion 93 of an edge opposite to edge 94 of lead 82. Edge portion 93 and edge 94 are positioned to match the size and placement of edge 96 and edge portion 97.

It should be noted that the parasitic capacitances between the ground connection on the receiver and the anode and cathode on the LED form a series connected capacitor that connects the anode and cathode of the LED. If the capacitance of this bypass path is too large, the signal response of the galvanic isolator will be degraded. Hence, there are limits to the size of the additional parasitic capacitance that is provided to provide improved CMR. In addition, the optimum additional capacitance could vary from device to device.

Figure 5:
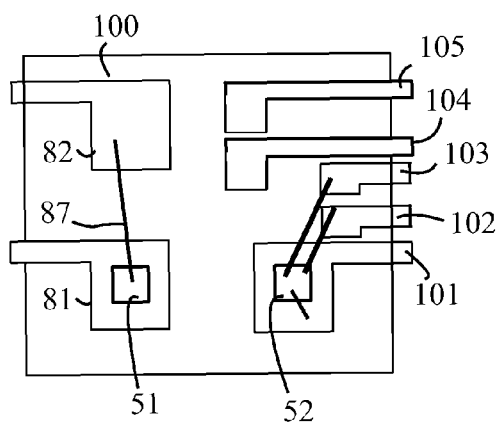
FIG. 5 illustrates another embodiment of a galvanic isolator according to the present invention.

Refer now to FIG. 5, which illustrates another embodiment of a galvanic isolator according to the present invention. Galvanic isolator 100 is similar to galvanic isolator 80 discussed above in that galvanic isolator 100 utilizes a die 51 having an LED thereon and a die 52 having a receiver to form a transmitter-receiver pair. Die 51 is mounted on lead 81 and connected thereto by a contact on the bottom surface of die 51. A second contact on the top surface of the die is connected to lead 82 by wire bond 87. Die 52 has three contacts on the upper surface of die 52. These contacts are connected to leads 101-103 by wire bonds. Galvanic isolator 100 utilizes a ground lead 101 that is similar in area to the receiver ground leads discussed above with reference to FIG. 3. In galvanic isolator 100, the additional lead frame area needed to add capacitance between lead 101 and lead 82 is provided by two additional leads 104 and 105 that are positioned to provide capacitive coupling to lead 82. The additional leads are positioned such that each additional lead capacity couples more to lead 82 than to lead 81. Hence, by selectively connecting these additional leads to lead 101 by a connection external to galvanic isolator 100 between lead 101 and one or more of leads 104 and 105, the magnitude of the relative parasitic capacitances can be controlled in a manner to equalize the parasitic capacitances in question.

If the additional CMR provided by including the additional parasitic capacitance is not needed in a particular application, leads 100 and 101 need not be connected, and hence, any degradation in performance that would have been caused by the additional parasitic capacitance is avoided. Hence, a single galvanic isolator part can be used for applications that require additional CMR and those that do not.

The above-described embodiments of the present invention increase the coupling capacitance between the anode of the LED on the transmitter side of the galvanic isolator and the ground lead on the receiver side of the galvanic isolator. However, in designs in which the anode has the larger coupling capacitance with the ground lead in the receiver, the additional capacitance could be added to the cathode lead.

Figure 6:
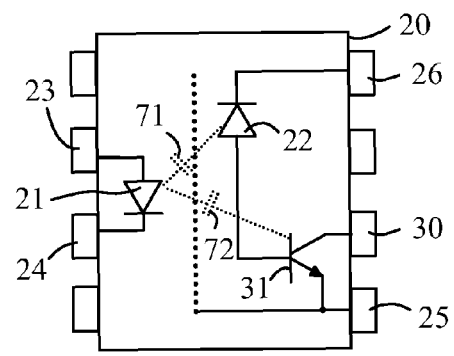
FIG. 6 illustrates additional capacitive couplings that can lead to CMR failure.

The above-described embodiments of the present invention utilize an additional capacitance to equalize the couplings between the ground on the receiver side and the anode and cathode of the photodiode on the transmitter side of the galvanic isolator. However, there are additional couplings that can lead to CMR failure. Refer now to FIG. 6, which illustrates some of the additional couplings. LED 21 is capacitively coupled both to photodiode 22 and amplifier 31 by the parasitic capacitances shown at 71 and 72, respectively. Even if the capacitive coupling between the anode and cathode of LED 22 and ground pin 25 are equalized, a high-frequency transient at LED 21 can be coupled to the receiver side of the galvanic isolator.

In one embodiment of the present invention, high-frequency transients at the anode and cathode of LED 22 are shorted to ground by providing additional capacitance between the anode and of LED 22 and ground and between the cathode of LED 22 and ground. Refer now to FIG. 7, which illustrates another embodiment of a galvanic isolator according to the present invention. Galvanic isolator 70 includes two additional capacitors that improve the CMR. Capacitor 74 connects the anode of photodiode 21 to ground pin 25, and capacitor 74 connects the cathode of photodiode 21 to ground pin 25. Capacitors 73 and 74 effectively short high frequency transients at the photodiode to ground thereby reducing the amplitude of such transients. In addition, the capacitors are chosen such that the capacitive coupling, including the parasitic capacitances 28 and 29, are substantially equal.

The maximum size of the capacitors is determined by the electrical signals that are being converted to light signals by photodiode 21 and the driver 76 that supplies these signals. Larger capacitors provide more effective shorting of transients than smaller capacitors. However, if the capacitors are too large, the frequency response of the photodiode-to-light conversion will be reduced. The driving circuit that supplies the signal pulses between pins 23 and 24 must charge the capacitors during the rise of each pulse and discharge the capacitors during the fall of each pulse. The capacitors, together with the drive circuit, effectively impose an RC time constant on the signal. If the time constant associated with the capacitors is long compared to the rise time, t, of the pulses, the frequency response of the galvanic isolator will be reduced. Hence, in one embodiment of the present invention, the capacitors are chosen such that the rise time associated with the capacitors when a predetermined driving circuit is utilized is less than the fastest rise time of the data signals being transmitted through the galvanic isolator.

As noted above, the capacitors are preferably sized such that the capacitive coupling between pins 25 and 23 and between pins 25 and 24 is substantially the same when the parasitic capacitances between these pins is taken into account. The degree to which these total capacitances need to be matched depends on the magnitude of the transients that are expected and the sensitivity of the receiver circuitry to such transients. For the purposes of this discussion, the capacitive coupling will be said to be substantially the same if the largest design transient that is to be protected against will not switch the state of the photodiode. That is, the transient signal will not cause the photodiode to generate light when the driver signal is at a logical 0 or cause the photodiode to stop generating light when the logic signal is a logical 1.

As noted above, the additional capacitance can be provided by connecting a capacitor between one of the LED leads and the ground lead on the receiver side of the galvanic isolator; however, an externally connected capacitor is not preferred because such connections between the high voltage and low voltage sides of a galvanic isolator can cause problems. The additional capacitor, however, could be included within the galvanic isolator package. Refer now to FIG. 8, which illustrates another embodiment of a galvanic isolator according to the present invention. Galvanic isolator 150 utilizes a capacitor 151 that is bonded between lead 56 on the transmitter side of galvanic isolator 150 and ground lead 53 on the receiver side. The capacitor is sized such that the coupling capacitance between leads 56 and 53 is substantially the same as the coupling capacitance between leads 51 and 53. Since capacitor 151 is contained in the package, the problems associated with connections between the receiver and transmitter sides of the galvanic isolator are reduced. In addition, the package can be filled with a clear insulating potting material to reduce the chance of shorts between the high and low voltage sides of the galvanic isolator.

Figure 9:
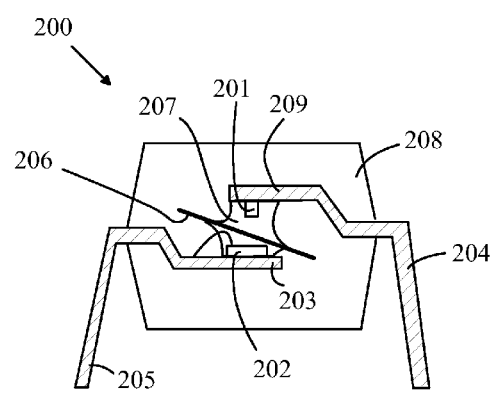
FIG. 9 is cross-sectional view of a prior art galvanic isolator.

The additional capacitance can also be built into the package by using appropriately shaped lead frame leads in a manner analogous to that described above. Refer now to FIG. 9, which is a cross-sectional view of a galvanic isolator 200 according to one prior art design. Galvanic isolator 200 includes an LED 201 and a photodetector 202. LED 201 is mounted on a first lead 204, and photodetector 202 is mounted on a second lead 205. A transparent dielectric layer 206 is provided between LED 201 and photodetector 202 to provide high-voltage isolation of LED 201 and photodetector 202. The connections between photodetector 202 and the other leads on the receiver side of galvanic isolator 200 have been omitted to simplify the drawing. Similarly, the additional connection to LED 201 has also been omitted. An area 207 of a clear silicone compound provides additional insulation and holds dielectric layer 206 in place. Finally, an opaque body 208 is molded around the lead frame.

In practice, leads 204 and 205 are shaped and positioned to minimize the capacitance between leads 204 and 205 in this type of prior art device. In particular, the leads only overlie one another in regions 203 and 209 and the distance between the leads is set to the maximum possible in view of other constraints such as the height of the package.

Figure 10:
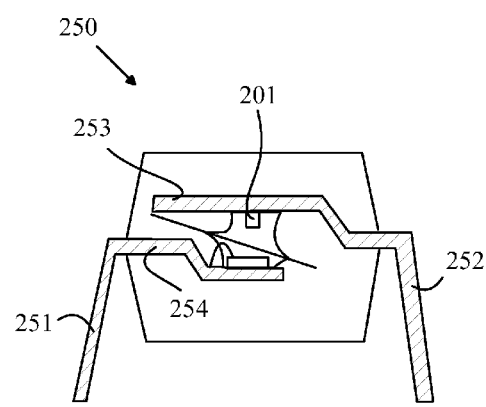
FIG. 10 is a cross-sectional view of another embodiment of a galvanic isolator according to the present invention.

Refer now to FIG. 10, which is a cross-sectional view of a galvanic isolator 250 according to one embodiment of the present invention. Galvanic isolator 250 differs galvanic isolator 200 in that leads 251 and 252 are shaped and positioned to provide additional capacitance. Lead 251 is connected to the ground on the receiver side of galvanic isolator 250; hence, this arrangement increases the capacitance between the ground pin and either the cathode or anode of LED 201, depending on which of the anode and cathode is connected to lead 252. In particular, lead 252 includes an extension that overlies region 254 of lead 251 and is positioned with respect to lead 254 such that the capacitance coupling lead 252 to lead 251 is at least 1.3 times the capacitance that would be present if extension 253 were absent. The distance between the leads in the region of the extension is significantly less than the distance between the leads in the region in which the LED and photodetector are mounted; hence, the extension regions are responsible for most of the capacitance between lead 261 and 262.

Figure 11:
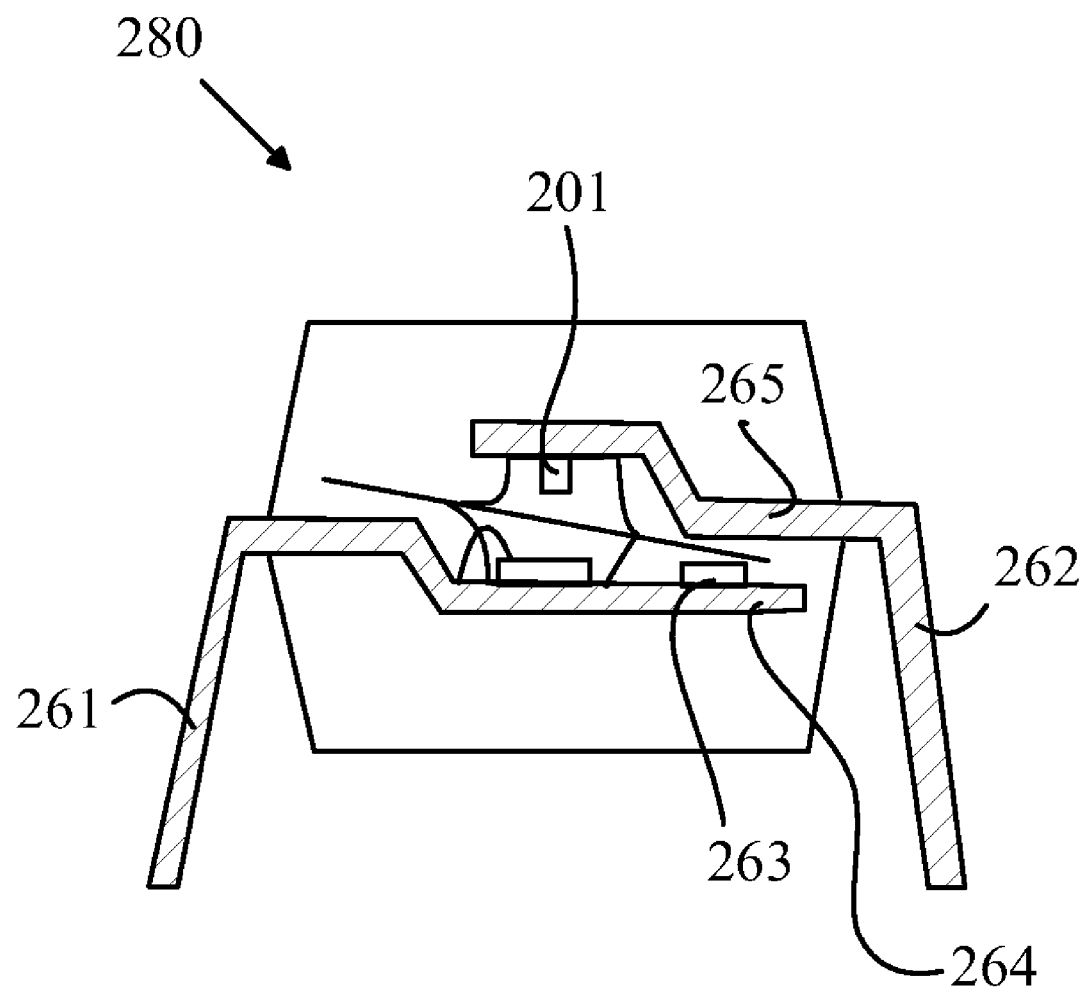
FIG. 11 is a cross-sectional view of yet another embodiment of a galvanic isolator according to the present invention.

The embodiment shown in FIG. 10 includes an extension on the lead on which the LED is mounted; however, embodiments in which the extension is on the ground lead on the receiver side can also be constructed. Refer now to FIG. 11, which is a cross-sectional view of another embodiment of a galvanic isolator according to the present invention. Galvanic isolator 280 utilizes a lead 261 with an extension 264 that underlies regions 265 of lead 262 to provide the additional capacitance. Either lead can include features such as raised area 264 to further adjust the capacitance between lead 261 and 262.

The above-described embodiments of the present invention utilize a photodiode as the photodetector that receives the light signal from the LED in the transmitter. However, other forms of photodetectors such as phototransistors could be utilized.

Various modifications to the present invention will become apparent to those skilled in the art from the foregoing description and accompanying drawings. Accordingly, the present invention is to be limited solely by the scope of the following claims.

What is claimed is:

1. A galvanic isolator comprising:
a transmitter die comprising an LED having first and second contacts for powering said LED;
a receiver die comprising a photodetector;
a lead frame comprising first and second transmitter leads, and first and second receiver leads, said transmitter die being bonded to said first transmitter lead, said first contact being connected electrically to said first transmitter lead and said second contact being connected to said second transmitter lead, and said receiver die being connected to said first and second receiver leads, wherein said LED and said photodetector are positioned such that light generated by said LED is received by said photodetector, and wherein said first and second transmitter leads are capacitively coupled to said first receiver lead, said capacitive couplings being characterized by first and second capacitance values, said first and second capacitive values being substantially the same.

2. The galvanic isolator of claim 1 wherein said photodetector comprises a photodiode.

3. The galvanic isolator of claim 1 wherein said photodetector comprises a phototransistor.

4. The galvanic isolator of claim 1 wherein said first capacitance value is substantially equal to a parasitic capacitance between said first transmitter lead and said first receiver lead.

5. The galvanic isolator of claim 4 wherein said second capacitance value is substantially equal to a parasitic capacitance between said second transmitter lead and said first receiver lead.

6. The galvanic isolator of claim 4 wherein said second capacitance comprises a parasitic capacitance between said second transmitter lead and said first receiver lead and a first capacitor connected to said second transmitter lead and said first receiver lead.

7. The galvanic isolator of claim 6 wherein said first capacitance comprises a parasitic capacitance between said first transmitter lead and said first receiver lead and a second capacitor connected between said first transmitter lead and said first receiver lead.

8. The galvanic isolator of claim 7 wherein said transmitter is characterized by a minimum rise time for logic signals that are to be transmitted by said transmitter and wherein said first and second capacitors are chosen such that a time constant associated with charging said first and second capacitors is less than said minimum rise time.

9. The galvanic isolator of claim 1 wherein said transmitter die, said receiver die and a portion of said lead frame are contained within a package, said first receiver lead comprising first and second sections that are electrically isolated within said package and having external portions that are isolated electrically but connectable by a conductor outside of said package.

10. The galvanic isolator of claim 9 wherein said second section is positioned to capacitively couple to said first transmitter lead more than to said second transmitter lead.

11. A method for communicating data between a first circuit and a second circuit, said method comprising:
providing a transmitter die having an LED, said LED having first and second contacts for powering said LED;
providing a receiver die comprising a photodiode;
said transmitter die and said receiver die being mounted on a lead frame comprising first and second transmitter leads, and first and second receiver leads, said transmitter die being bonded to said first transmitter lead, said first contact being connected electrically to said first transmitter lead and said second contact being connected to said second transmitter lead, and said receiver die being connected to said first and second receiver leads, wherein said LED and said photodetector are positioned such that light generated by said LED is received by said photodetector, and wherein said first and second transmitter leads are capacitively coupled to said first receiver lead, said capacitive couplings being characterized by first and second capacitance values; and causing said first and second capacitance values to be substantially equal to one another, 12. The method of claim 11 wherein said first and second capacitance values are adjusted by choosing said lead frame leads such that a parasitic capacitance between said first transmitter lead and said first receiver lead is substantially the same as a parasitic capacitance between said second transmitter lead and said first receiver lead.

13. The method of claim 11 wherein said second capacitance is substantially equal to a parasitic capacitance between said second transmitter lead and said receiver lead plus a trim capacitor that is connected between said second transmitter lead and said receiver lead.

14. The method of claim 11 wherein said transmitter die, said receiver die and a portion of said lead frame are contained within a package, said first receiver lead comprising first and second sections that are electrically isolated within said package and having external portions that are isolated electrically but connectable by a conductor outside of said package and wherein said first and second capacitances are adjusted by connecting said first section to said second section.

15. The method of claim 14 wherein said second section is positioned to capacitively couple to said first transmitter lead more than to said second transmitter lead.

* * * * *